US006759742B2

(12) United States Patent
Budka

(10) Patent No.: US 6,759,742 B2
(45) Date of Patent: Jul. 6, 2004

(54) INTERCHANGEABLE BOND-WIRE INTERCONNECTS

(75) Inventor: Thomas Philip Budka, Shirley, MA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/415,629

(22) Filed: Oct. 12, 1999

(65) Prior Publication Data

US 2001/0048155 A1 Dec. 6, 2001

(51) Int. Cl.[7] ............................................. H01L 23/34
(52) U.S. Cl. ..................... 257/728; 257/775; 257/690; 257/673
(58) Field of Search ............................... 257/728, 775, 257/778, 798, 723, 690, 673; 273/668; 438/611, 617, 618

(56) References Cited

U.S. PATENT DOCUMENTS

| | | | | |
|---|---|---|---|---|
| 3,711,778 A | * | 1/1973 | Day | 325/446 |
| 4,680,560 A | * | 7/1987 | Yorita et al. | 333/206 |
| 4,733,203 A | * | 3/1988 | Ayasli | 333/139 |
| 4,901,041 A | * | 2/1990 | Pengelly | 333/33 |
| 5,214,397 A | * | 5/1993 | Muller | 332/105 |
| 5,258,626 A | * | 11/1993 | Suzuki et al. | 257/39 |
| 5,258,646 A | * | 11/1993 | Katoh | 257/678 |
| 5,392,051 A | * | 2/1995 | Uematsu et al. | 342/165 |
| 5,394,154 A | * | 2/1995 | Uematsu et al. | 342/165 |
| 5,608,263 A | * | 3/1997 | Drayton et al. | 257/728 |
| 5,663,597 A | * | 9/1997 | Nelson et al. | 257/734 |
| 5,696,466 A | * | 12/1997 | Li | 330/286 |
| 5,717,400 A | * | 2/1998 | Uematsu et al. | 342/165 |
| 5,777,528 A | * | 7/1998 | Schumacher et al. | 333/246 |
| 5,847,451 A | * | 12/1998 | Ohtaki et al. | 257/697 |
| 5,913,134 A | * | 6/1999 | Drayton et al. | 438/456 |
| 5,933,062 A | * | 8/1999 | Kommrusch | 333/193 |
| 5,973,567 A | * | 10/1999 | Heal et al. | 330/286 |
| 6,023,209 A | * | 2/2000 | Faulkner et al. | 257/664 |
| 6,034,580 A | * | 3/2000 | Henderson et al. | 333/204 |
| 6,194,774 B1 | * | 2/2001 | Cheon | 257/531 |

FOREIGN PATENT DOCUMENTS

| | | | | |
|---|---|---|---|---|
| JP | 55040165 | * | 10/1981 | H04L/27/20 |
| JP | 357091542 A | * | 6/1982 | |

OTHER PUBLICATIONS

IEEE MTT–S Newsletter, No. 149, Summer 1998, Interconnects and Packaging of Millimeter Wave Circuits, pp. 39–42. Millimeter–Wave Performance of Chip Interconnections Using Wire Bonding and Flip Chip. T. Krems, W. Haydl, H. Massler, J. Rudiger. pp. 1–4.

T. Krems et al., Millimeter–Wave Performance of Chip Interconnections using Wire Bonding and Flip Chip. IEEE MTT–S Newsletter, 1996. pp. 247–250.

Wolfgang Menzel, Interconnects and Packaging of Millimeter Wave Circuits, IEEE MTT–S Newsletter, Summer 1998, pp. 39–42.

* cited by examiner

*Primary Examiner*—Wael Fahmy
*Assistant Examiner*—Nathan W. Ha

(57) ABSTRACT

A method for making a bond-wire interconnect to pass signals between different substrates is described. According to this process, a first compensated bond wire interconnect is made to connect two substrates of a first type at an operating frequency, the first interconnect comprising a bond-wire of a fixed length and a first pair of compensation structures formed from a lowpass filter prototype. A second compensated bond wire interconnect is made to connect two substrates of a second type at the operating frequency, the second interconnect having a bond-wire of the fixed length and a second pair of compensation structures formed from the lowpass filter prototype. A bond-wire of the fixed length, one compensation structure from the first pair, and one compensation structure from the second pair, are combined to make a third compensated bond wire interconnect to connect a substrate of the first type with a substrate of the second type at the operating frequency.

12 Claims, 5 Drawing Sheets

INTERCHANGEABLE BOND-WIRE INTERCONNECTS

FIELD OF THE INVENTION

The invention relates to connection devices in general. More particularly, the invention relates to an interchangeable bond wire interconnect operating at radio frequencies (RF) or above that is capable of being utilized with a plurality of substrates.

BACKGROUND OF THE INVENTION

Typical wireless communication devices utilize semiconductors operating at radio frequencies (RF) or above. Recently, there has been increasing demand for the use of semiconductors operating at millimeter wave frequencies. Semiconductor devices using the millimeter wave spectrum, however, are more sensitive to device parasitics than the same semiconductor devices using RF. Accordingly, the typical parasitics tolerated at lower frequencies will preclude adequate performance of devices operating at the higher millimeter wave frequencies.

One such device parasitic is the complex impedance, primarily inductance, of the bond wire interconnect used to pass electrical signals between a pair of semiconductor devices, a semiconductor device and a earner board or between two carrier boards. The bond wire is typically a gold wire or ribbon that is connected using thermal and ultrasonic energy to a first bonding or contact pad for a first semiconductor device or carrier board at the other end. Examples of the first and second semiconductor devices include different millimeter-wave Monolithic Microwave Integrated Circuits (MNIC), or a MMIC and a carrier board onto which the MMIC is directly attached, or two carrier boards. An example of a carrier board would be a microwave circuit board. Examples of a microwave circuit board include glass, alumina, duroid, quartz, FR-4, and so forth.

The significant inductive component of the bond wire operates to attenuate high frequency signals passing between the interconnected semiconductor devices unless their values are extremely low (2pif L<<1), where f is the frequency in Hertz (Hz) and L is the inductance of the bond wire in Henrys. Previous techniques have focused on reducing the length of the bond wire and chip-to-chip spacing to improve the high frequency performance of the bond wire. Manufacturing limitations, however, typically demand longer bond wire lengths and wider chip-to-chip spacing to improve the manufacturability of a specific module or multi-chip assembly (MCA).

One technique for increasing the length of the bond wire utilizes a filter theory approach to interconnect design. According to basic filter theory the bandwidth of a filter can be increased by adding more stages to the filter. This continues until adding additional stages becomes inappropriate due to unacceptable filter losses. Typically, low-pass filters are between three and seven stages. It has been previously recognized that the bond wire could be treated as a single stage low-pass filter with a fixed cutoff frequency. Consequently, the bandwidth and/or length of the bond wire could be increased by adding additional filter stages to the interconnect. Accordingly, filter-like compensation structures were added to the bonding pads to improve the high frequency response capability of the longer bond wires.

A problem occurs, however, when designing a bondwire interconnect having specific compensation structures for use in connecting two different semiconductor or microwave substrates. Specifically, the compensation structures for each millimeter-wave bondwire interconnect changes as the type of semiconductor or microwave substrate changes. For example, to interconnect a gallium arsenide (GaAs) MMIC to a glass substrate requires a specific bond wire interconnect design incorporating such factors as the type of substrate, the compensation structure, the length of the bond wire, the desired operating frequency and so forth. Each interconnect design, however, is the result of a complex and time-consuming design process. Thus, as the type of substrate changes this tedious design process must be repeated, which in turn may require modifications to the equipment used to manufacture each interconnect.

In view of the foregoing, it can be appreciated that a substantial need exists for a bond-wire interconnect to pass higher frequencies such as millimeter-wave frequencies that solves the aforementioned problems.

SUMMARY OF THE INVENTION

One embodiment of the invention comprises a method for making a bond-wire interconnect to transfer signals between different substrates. According to this process, a first compensated bond wire interconnect is made to connect two substrates of a first type at an operating frequency, the first interconnect comprising a bond-wire of a fixed length and a first pair of compensation structures formed from a low-pass filter prototype. A second compensated bond wire interconnect is made to connect two substrates of a second type at the operating frequency, the second interconnect having a bond-wire of the fixed length and a second pair of compensation structures formed from the low-pass filter prototype. A bond-wire of the fixed length, one compensation structure from the first pair, and one compensation structure from the second pair, are combined to make a third compensated bond wire interconnect to connect a substrate of the first type with a substrate of the second type at the operating frequency.

With these and other advantages and features of the invention that will become hereinafter apparent, the nature of the invention may be more clearly understood by reference to the following detailed description of the invention, the appended claims and to the several drawings attached herein.

DETAILED DESCRIPTION OF THE PREFERRED EMBODIMENTS

Figure 1:
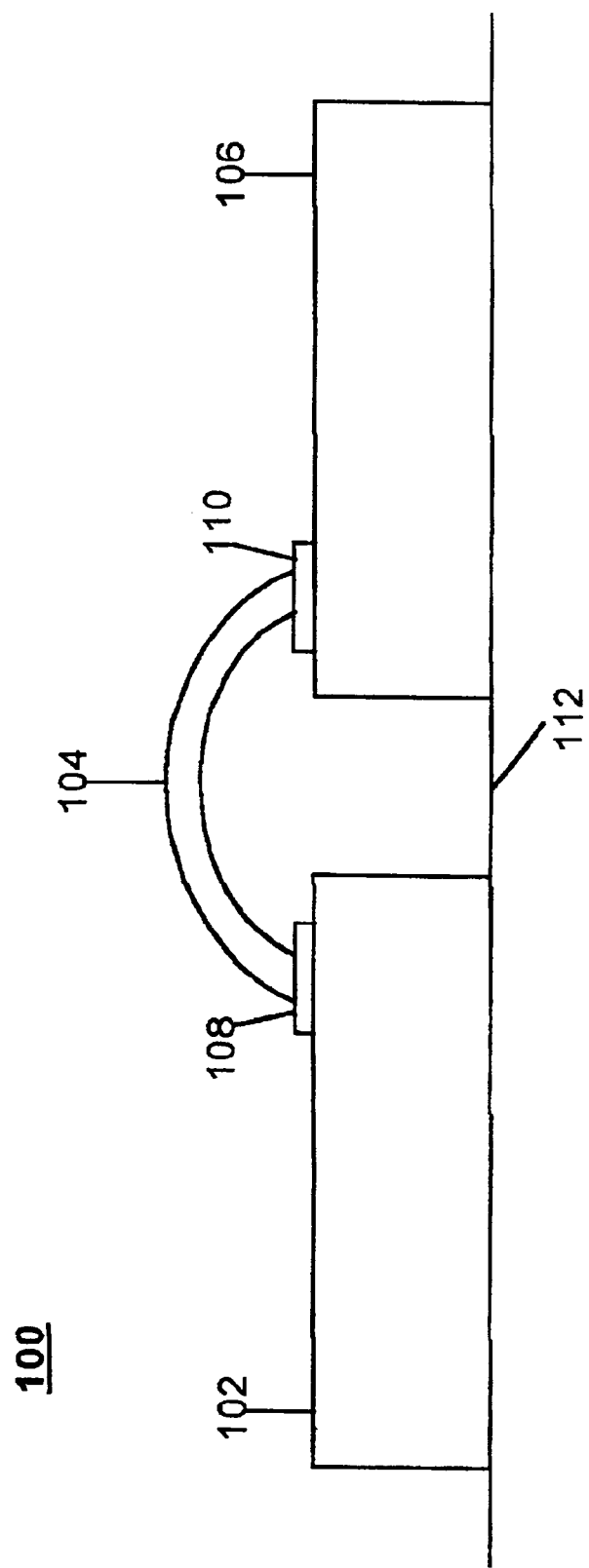
FIG. 1 illustrates a simplified side view of a bond wire for establishing an electrical connection between contact pads for a first and second glass chip according to the present invention.

The embodiments of the invention comprise an interchangeable compensated bond wire interconnect that significantly extends the operating frequency of fixed length bond wire interconnects between microwave circuits. The interconnect of the present invention maximizes bond wire length as well as landing pad size while simultaneously extending the cutoff frequency of the interconnect. The interconnect is also interchangeable in the sense that it can be used to connect different types of semiconductor substrates, such as glass, silicon, GaAs, Duroid, quartz, FR-4, alumina or any epoxy based copper clad printed circuit board material, or any combination thereof, without redesigning the interconnect.

In this embodiment of the invention, basic filter theory is used to develop a five-stage lowpass filter prototype for use in the design of the compensated bond wire interconnect. Microstrip interconnects function as a five-stage lowpass filter implementation of a five-stage lowpass filter prototype on both 100 micrometer thick GaAs and 127 micrometer thick glass substrates. After designing each interconnect between like substrates to a specific filter prototype or a specific low-pass frequency response, combinations of interconnects may be created that connect substrates of different types, such as GaAs to glass circuits, without redesign of the interconnect. Families of standard interconnects can be created in this manner for an entire array of substrates.

To help facilitate a description for the embodiments of the invention, and as an example the design of a first compensated bond wire interconnect that connects 5 mil (127 micrometer) thick glass chips to each other with an operating frequency of 76 GHz will be described according to one embodiment of the invention. A 76 GHz glass to glass compensated bond wire interconnect is particulary useful for automotive radar applications. It can be appreciated that the design techniques described herein may be applied at any operating frequency and on any other substrate (glass, silicon, alumina, GaAs, Duroid, quartz, FR-4, etc. . . . ) and enable the use of significantly longer bond wires as long as each chip has filter-like compensation on the bonding pads. For example, the design techniques may be used to design a second compensated bond wire interconnect that connects 100 micrometer thick GaAs MMIC chips to each other with an operating frequency of 76 GHz, using the same filter prototype as used for the first interconnect. By designing the first and second interconnects towards the same filter prototype, the first and second interconnects may be cut in half and interchangeably used while maintaining the same frequency response. Accordingly, the first and second interconnects may be used to form a third compensated bond wire interconnect that is capable of carrying signals between the substrate used for the first compensated bond wire interconnect (i.e., glass substrate) and the substrate used for the second compensated bond wire interconnect (i.e., GaAs substrate), without going through the entire design process used for both the first and second interconnects. It can be appreciated that this process can be applied to any number of interconnects connecting any type of substrates to form an interconnect to connect two different substrates, and that this process still falls within the scope of the invention.

In accordance with one implementation of the embodiment, the design of the 76 GHz compensated bond wire interconnect utilizes Hewlett Packard Company's Libra™ software (Libra) to form a structural model optimizing the interconnect for bandwidth. The structure can be simulated using Hewlett Packard Company's Momentum™ (HP Momentum) software where thin strip equivalent airbridges are used for the bond wires. An equivalent thin strip air-bridge width is first found that has the same impedance as a round bond wire by using a 2D quasi-static simulator from Macsyma named "PDEase2D." For the case of a 1 mil (25.4 micrometer) diameter wire bond that is 10 mils (254 micrometers) above a ground plane, a 2.3 mil (58 micrometer) wide thin strip will have the same impedance of 213 ohms. The electromagnetic data is then fitted with a Libra physical model where the dimensions of the model match the layout dimensions. Shunt capacitances and bond wire inductances are allowed to vary to fit the eletromagnetic simulated results. Next, the Libra physical model is tweaked to find which changes in the layout will drive the performance in the desired direction. The layout is changed and the process is iterated until acceptable performance is achieved.

After the best design is achieved, the final design response can be verified by a second simulator such as Ansoft's Maxwell Eminence (Maxwell Eminence) software. Two key design issues are addressed by this iterative procedure. First, by using HP Momentum instead of Maxwell Eminence, the design cycle time is reduced to lass than one day for each iteration compared to three days for Maxwell Eminence. Also, by using Libra physical models, changes in the layout can be predicted accurately before selecting to run a processor intensive electromagnetic stimulation. An interconnect of the present invention which may be formed using this design process will now be discussed with reference to FIGS. 1–3. Although specific design software and processes are outlined herein to form various interconnects, it can be appreciated that any type of design software and/or processes can be used and still fail within the scope of the invention.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Referring now in detail to the drawings wherein like parts are designated by like reference numerals throughout, there is illustrated in FIG. 1 a simplified side view of a bond wire for establishing making an electrical connection between contact pads of a first and second glass chip according to the present invention. FIG. 1 illustrates a semiconductor subsystem 100 comprising a first semiconductor device 102 connected to a second semiconductor device 106 via a bond wire 104. Semiconductor devices 102 and 106 have an RF ground plane 112. Examples of first semiconductor device 102 and second semiconductor device 106 are a pair of 127 micrometer thick glass chips. The term "bond wire" as used herein refers to any uncompensated interconnection between two electrical points, such as a gold wire, gold ribbon, or other similar structure. Further, bond wire 104 has a wire length and an associated inductance value. It can be appreciated that although a single bond wire 104 is shown in FIG. 1, any number of bond wires can be used and the use of which still falls within the scope of the invention as long as the associated inductance value of the combined bond wires matches the desired application.

Bond wire 104 is connected to first semiconductor device 102 and second semiconductor device 106 via a first contact pad 108 and a second contact pad 110, respectively. The ends of the bond wire 104 are attached to first and second contact pads 108 and 110, respectively, using conventional bond wire attachment technology. Contact pads 108 and 110 both comprise filter-like compensation structures, discussed in more detail below. The combination of bond wire 104 and contact pads 108 and 110 are referred to herein as a "compensated bond wire interconnect." The filter-like compensation structures of contact pads 108 and 110 are tuned to combine with bond wire 104 to create a low pass filter having an operating frequency of the desired application.

Sub-system 100 utilizes a compensated bond wire interconnect made in accordance with a filter prototype. The design of a filter prototype for an interconnect begins using basic filter theory. There are well known published tables in the literature of the relative values of the inductances and capacitances for filter design. For example, if a 0.5 decibel (dB) equal-ripple response is desired, then a single inductor filter would have an inductance of 0.70 L. A five-stage equal-ripple filter with the same cutoff frequency would have a center inductor of 2.54 L and two outer inductors of 1.71 L, where L is the inductance that selects the cutoff frequency of the filter. This implies that for the same cutoff frequency of the single and five stage filter, the center inductor in the five stage design can have a 3.6 times higher inductance than a single inductor design. This directly translates into a 3.6 times longer bond wire for the same cutoff frequency. The ability to lengthen the bond wires is useful for high yield assembly of millimeter wave multi-chip modules.

In this embodiment of the invention, the filter prototype is a five-stage low-pass filter, but in other embodiments, it can be any stage filter. Microstrip interconnects in this embodiment are designed using the five-stage low-pass filter prototype and electromagnetic simulators which match the specific low-pass filter response of the filter prototype on 5 mil (127 micrometer) thick glass substrates. The measurements for the microstrip interconnects indicate a return loss better than 12 decibels (dB) and less than 0.2 dB insertion loss up to 85 GHz using two 17 mils (432 micrometer) long, 1 mil (25 micrometer) diameter ball bonds. For comparison, an uncompensated interconnect with two 17 mils (432 micrometer) long bond wires has 1 dB insertion loss and 10 dB return loss at 40 GHz and continues to degrade at higher frequencies. An example of a filter prototype which may be used to form the sub-system 100 according to the present invention is shown in FIG. 2.

Figure 2:
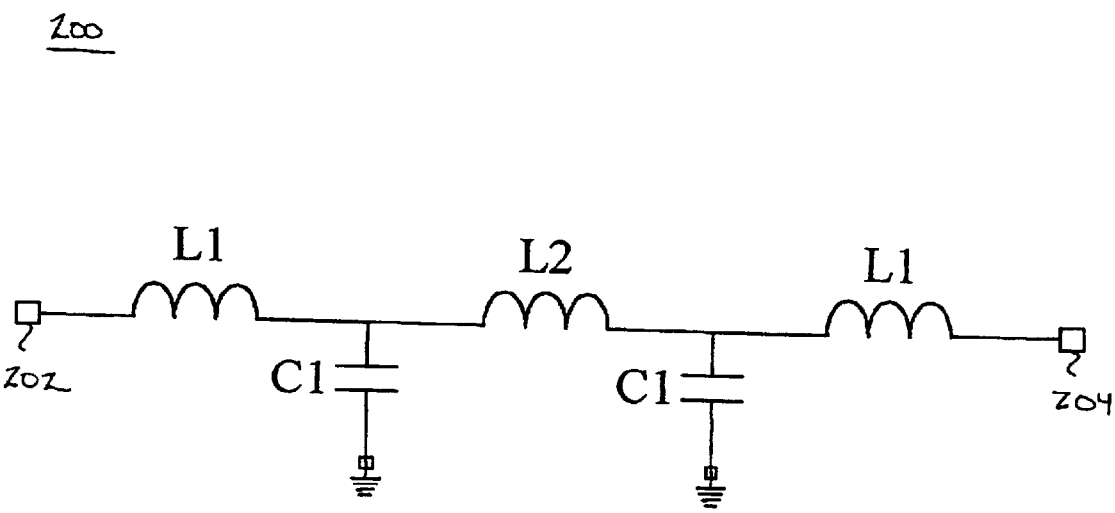
FIG. 2 illustrates a circuit diagram equivalent of a filter prototype in accordance with one embodiment of the invention.

FIG. 2 illustrates a circuit diagram equivalent of a filter prototype in accordance with one embodiment of the invention. Specifically, FIG. 2 illustrates a circuit diagram equivalent of a five-stage low-pass filter prototype 200. Five-stage low-pass filter prototype 200 comprises an inductor L2 and a pair of inductors L1 electrically disposed in series between a first port 202 and a second port 204. In this embodiment of the invention, ports 202 and 204 are 50 ohm ports. Further, filter prototype 200 also comprises a pair of shunt capacitors C1 electrically disposed in parallel to one another.

Figure 3:
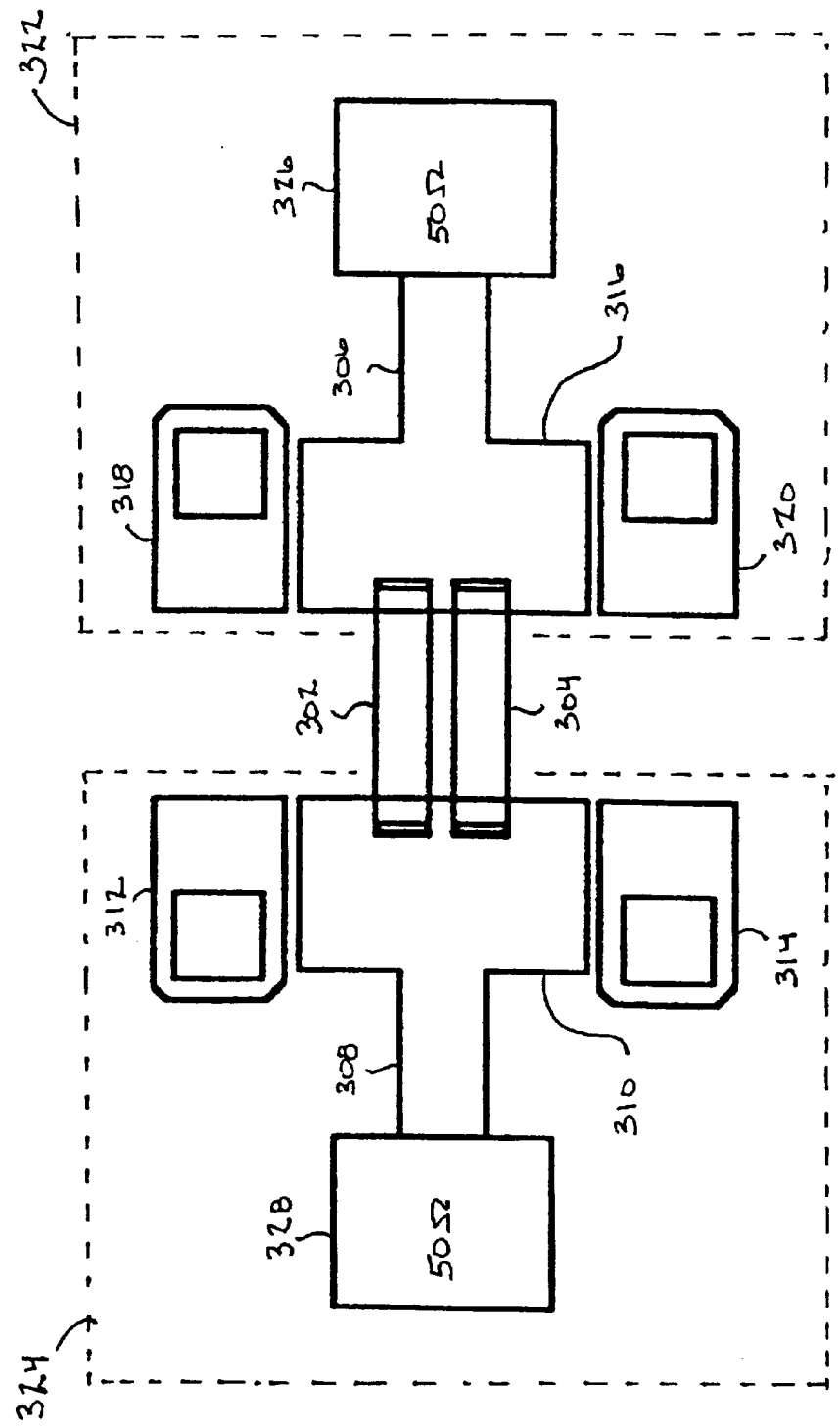
FIG. 3 displays a top view layout of a glass to glass compensated bond wire interconnect in accordance with one embodiment of the invention.

FIG. 3 displays a top view layout of a glass-to-glass compensated bond wire interconnect in accordance with one embodiment of the invention. FIG. 3 illustrates a compensated bond wire interconnect 300 utilizing the five-stage low-pass filter prototype discussed with reference to FIG. 2. Compensated bond wire 300 comprises a pair of compensation structures 322 and 324 which are connected by a pair of 25 micrometer diameter bond wires 302 and 304. Bond wires 302 and 304 are made of gold wire and are each 432 micrometers long. Compensation structure 322 comprises a bond pad 316 connected to a short high impedance transmission line 306. Bond pad 316 has ground pads 318 and 320 on each side, respectively. High impedance transmission line 306 is connected to a 50 ohm port 326. Compensation structure 324 comprises a bond pad 310 connected to a short high impedance transmission line 308. Bond pad 310 has ground pads 312 and 314 on each side, respectively. High impedance transmission line 308 is connected to a 50 ohm port 328.

Referring again to FIG. 2, L2 is realized in compensated bond wire interconnect 300 with the bond wire inductance of bond wires 302 and 304. L1 is realized by the short high impedance section of transmission lines 306 and 308. C1 is realized by a combination of the short low impedance bond pads 310 and 316, and the bond pad gap capacitance to ground pads 312 and 314, and 318 and 320, on either side of bond pads 310 and 316, respectively.

In operation, exemplary inductance values of bond wires 302 and 304 may be simulated to be between 0.115 nH and 0.155 nH if the bond wire lengths range from 15 mils (381 micrometers) to 19 mils (483 micrometers) long. For the design target of two 17 mils (432 micrometer) long, 1 mil (25.4 mm) diameter ball bonds, an insertion loss of 0.2 dB is measured at 76 GHz with a return loss of 17 dB. By way of comparison, a previous compensated air coplanar bond wire interconnect using 16 mils (410 micrometer) long, 0.7 mil (17 micrometer) wires, an insertion loss of 1.5 dB and a return loss of 20 dB was achieved at 76 GHz. The glass-to-glass compensated bond wire interconnect described herein meets a design goal of >10 dB return loss and <0.3 dB insertion loss for automotive applications at 76 GHz for bond wire lengths that vary in length from 15 mils (381 micrometers) to 19 mils (483 micrometers).

Figure 4:
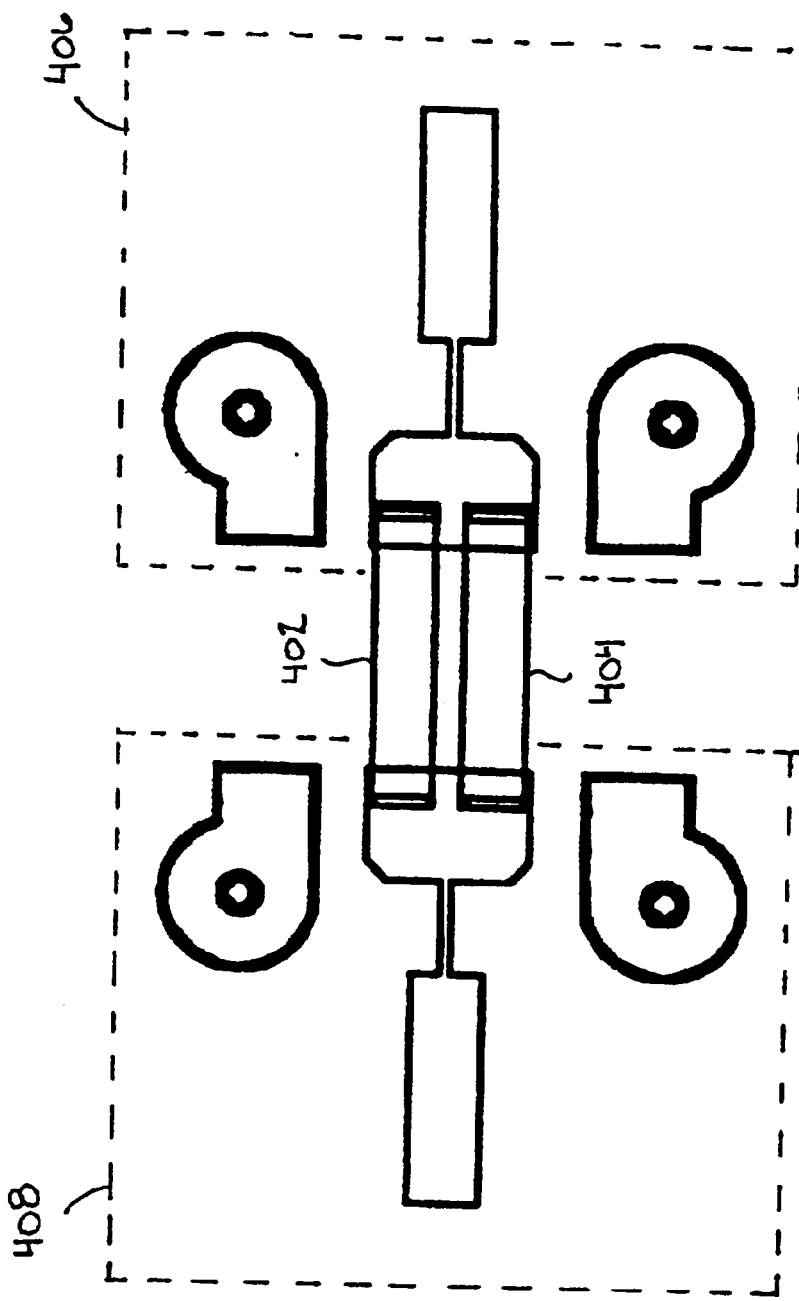
FIG. 4 displays a top view layout of a GaAs to GaAs compensated bond wire interconnect in accordance with one embodiment of the invention.

FIG. 4 displays a top view layout of a GaAs-to-GaAs compensated bond wire interconnect in accordance with one embodiment of the invention. FIG. 4 displays a compensated bond wire interconnect 400 comprising a pair of compensation structures 406 and 408 which are connected by a pair of 25 micrometer diameter bond wires 402 and 404. Bond wires 402 and 404 are made of gold wire and are of the same length and diameter as bond wires 302 and 304 of compensated bond wire interconnect 300. Compensation structures 406 and 408 are made using the same design techniques and filter prototype (FIG. 2) used to create the 76 GHz glass-to-glass compensated bond wire interconnect 300 described with reference to FIG. 3. Specifically, compensation structures 406 and 408 each utilize a combination of high impedance transmission lines, bond pads and grounding pads to realize L1 and C1 of the filter prototype shown in FIG. 2, while bond wires 402 and 404 realize L2 of the filter prototype shown in FIG. 2. Since compensated bond wire interconnect 400 is designed using the five-stage low-pass filter prototype described with reference to FIG. 2, it has the same operating frequency as interconnect 300, that is 76 GHz.

Figure 5:
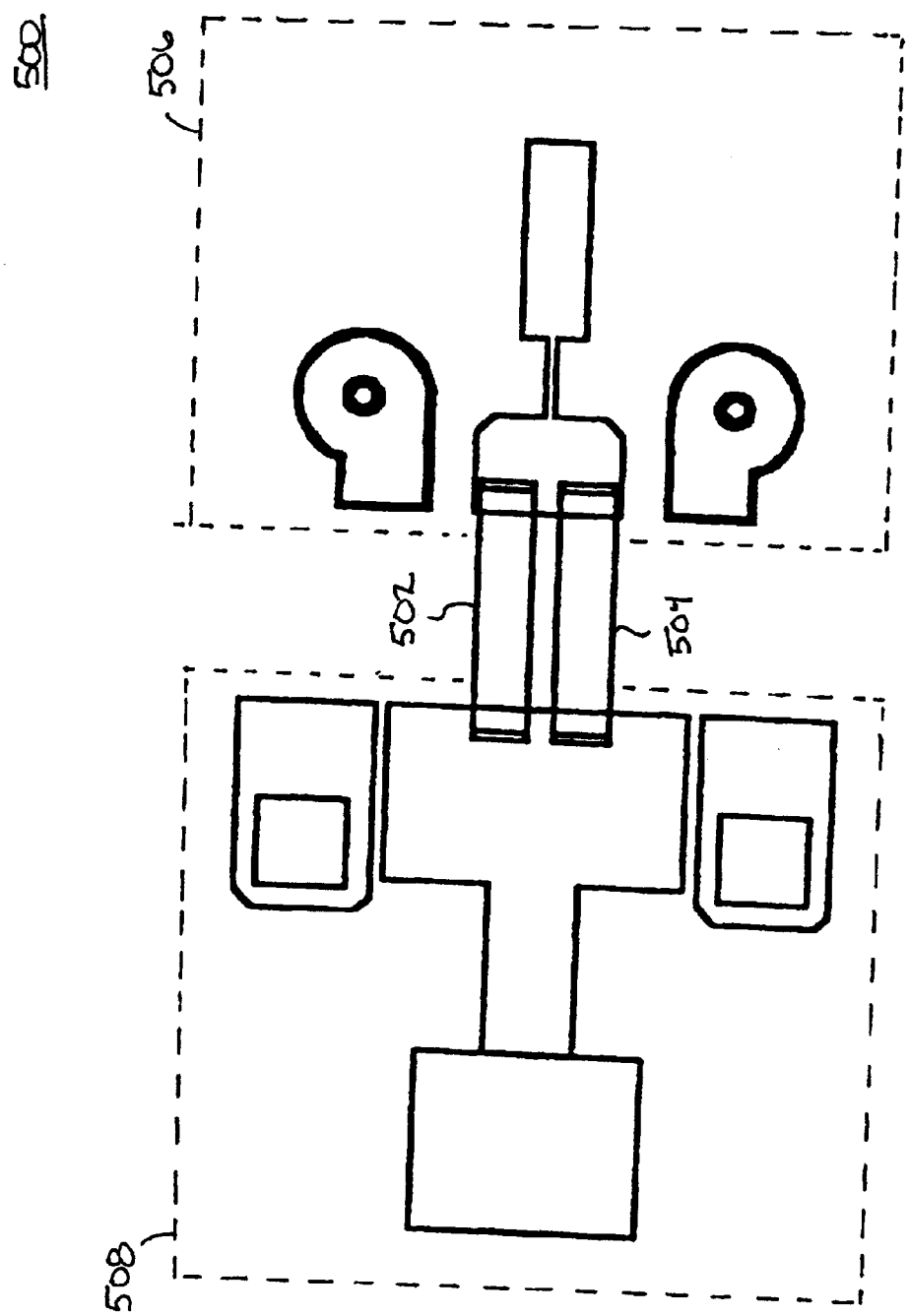
FIG. 5 displays a top view layout of a glass to GaAs compensated bond wire interconnect in accordance with one embodiment of the invention.

FIG. 5 displays a top view layout of a glass to GaAs compensated bond wire interconnect in accordance with one embodiment of the invention. FIG. 5 displays a compensated bond wire interconnect 500 comprising a pair of compensation structures 506 and 508 which are connected by a pair of 25 micrometer diameter bond wires 502 and 504. Bond wires 502 and 504 are made of gold wire and are of the same length and diameter as bond wires 302 and 304 of compensated bond wire interconnect 300. Compensation structure 508 is substantially the same as compensation structure 324 of compensated bond wire interconnect 300 shown in FIG. 3. Compensation structure 506 is substantially the same as compensation structure 406 of compensated bond wire interconnect 400 shown in FIG. 4.

Because compensation structures 506 and 508 were made using the same design techniques and filter prototype (FIG. 2), they are interchangeable with respect to each other as long as the bond wires used to connect compensation structures 506 and 508 are substantially the same length as bond wires 302 and 304 of interconnect 300, or bond wire 402 and 404 of interconnect 400, respectively. Since they are interchangeable, the design process and techniques used to make interconnects 300 and 400 do not have to be reapplied to the design of interconnect 500.

In operation, compensation structures 506 and 508 each realizes L1 and C1 of the filter prototype shown in FIG. 2, while bond wires 502 and 504 realize L2. Consequently, the combination of bond wires 502 and 504 and compensation elements 506 and 508 are tuned to operate as a five-stage low-pass filter having the specific operating frequency as interconnects 300 and 400, that is, approximately 76 GHz.

Although each of the interconnects 300, 400, and 500 has been described herein to include a pair of bond wires 302 and 304, 402 and 404, and 502 and 504, this is not a requirement and only serves as an example for explaining the invention. The interconnect may have any number of bond wires as long as the associated inductance value of the combined bond wires matches the desired value appropriate for the application.

Although various embodiments are specifically illustrated and described herein, it will be appreciated that modifications and variations of the present invention are covered by the above teachings and within the purview of the appended claims without departing from the spirit and intended scope of the invention. For example, although the design of compensated bond wire interconnect 500 was in terms of an interconnect to connect a glass substrate to a GaAs substrate, it can be appreciated that the same design techniques can be used to make and interconnect to connect many different types of substrates and still fall within the scope of the invention. For example, an alumina to alumina compensated bond wire interconnect and a duroid-to-duroid compensated bond wire interconnect could be used to make an alumina-to-duroid compensated bond wire interconnect using the principles described herein.

What is claimed is:

1. An interchangeable bond-wire interconnect capable of connecting a first and a second device of different semiconductor substrates, comprising:
   a bond wire having a first end, a second end and a fixed length;
   a first compensation structure containing a first contact pad, said pad connected to said first end of said bond wire, said first compensation structure formed on a device of a first substrate type, said first compensation structure being configured according to a first filter prototype, said first prototype designed to transfer signals between a pair of devices of said first substrate type at an operating frequency; and
   a second compensation structure containing a second contact pad, said pad connected to said second end of said bond wire, said second compensation structure formed on a device of a second substrate type, said second compensation structure configured according to a second filter prototype, said second prototype designed to transfer signals between a pair of devices of said second substrate type at said operating frequency.

2. The interconnect of claim 1, wherein said first type is one of a group comprising glass, silicon, gallium arsenide, duroid, quartz, FR-4 and alumina.

3. The interconnect of claim 1, wherein said second type is one of a group comprising glass, silicon, gallium arsenide, duroid, quartz, FD-4 and alumina.

4. The interconnect of claim 1, wherein said filter prototype is a five-stage low-pass filter, and said bond wire and said first and second compensation structures correspond to said five-stage low-pass filter.

5. The interconnect of claim 1, wherein said operating frequency is a millimeter wave frequency.

6. The interconnect of claim 1, wherein said bond-wire length is approximately 432 micrometers long.

7. The interconnect of claim 1, wherein said first compensation structure further includes a first high impedance transmission line directly connected between said first contact pad and a first part.

8. The interconnect of claim 7, wherein said second compensation structure further includes a second high impedance transmission line directly connected between said second bond pad and a second port.

9. The interconnect of claim 8, wherein said first compensation structure further includes a pair of first pound pads formed on the sides of said first bond pad, and said second compensation structure further includes a pair of second ground pads formed on the sides of said second bond pad.

10. The interconnect of claim 1, further comprising:
    another bond-wire disposed in parallel to said first bond-wire and directly connected between said first and second bond pads of said hut and second compensation structures.

11. The interconnect of claim 1, wherein said first and second compensation structures are not part of the same line structure.

12. The interconnect of claim 1, wherein said first compensation structure is interchangeably usable in lieu of another said second compensation structure, and said second compensation structure is interchangeably usable in lieu of another said first compensation structure.

* * * * *